(12) United States Patent
Bartolini et al.

(10) Patent No.: US 7,804,322 B2
(45) Date of Patent: Sep. 28, 2010

(54) OUTPUT BUFFER

(76) Inventors: Michele Bartolini, Piazza Piemonte, 5/H, I-20077 - Melegnano (MI) (IT); Pier Paolo Stoppino, Via Pergolesi, 23, I-20124-Milano (IT); Paolo Pulici, Via Cattaneo, 98, I-20025-Legnano (MI) (IT); Gian Pietro Vanalli, Via Cascine, 13A, I-24030-Almenno San Bartolomeo (BG) (IT)

( * ) Notice: Subject to any disclaimer, the term of this patent is extended or adjusted under 35 U.S.C. 154(b) by 54 days.

(21) Appl. No.: 12/261,101

(22) Filed: Oct. 30, 2008

(65) Prior Publication Data

US 2009/0167370 A1    Jul. 2, 2009

Related U.S. Application Data

(62) Division of application No. 11/638,321, filed on Dec. 13, 2006, now Pat. No. 7,463,051.

(30) Foreign Application Priority Data

Dec. 21, 2005   (EP)   ................................ 05425900

(51) Int. Cl.
*H03K 17/16* (2006.01)
*H03K 19/003* (2006.01)

(52) U.S. Cl. ............................. 326/26; 326/27; 326/32; 326/33

(58) Field of Classification Search ........................ None
See application file for complete search history.

(56) References Cited

U.S. PATENT DOCUMENTS 6,624,671 B2 *  9/2003  Fotouhi ...................... 327/112
6,747,514 B1 *  6/2004  Aude ......................... 330/253

* cited by examiner

Primary Examiner—Anh Q Tran
(74) Attorney, Agent, or Firm—Trop, Pruner & Hu, P.C.

(57) ABSTRACT

An output buffer includes at least a first and a second stage, wherein each stage is formed by respective first transistors and second transistors coupled in series with each other between a first and a second voltage reference. The coupled first and second transistors have a common conduction terminal connected to an output terminal of the output buffer. An input terminal of the buffer is connected to control terminals of the transistors of the first stage through a first open loop driving circuit. A second feedback driving circuit is connected between the input terminal and the control terminals of the transistors of the second stage. The second feedback driving circuit includes a current detector operating to detect a maximum in the value of the current drawn by and supplied to the output buffer. A comparison block, having a threshold value, detects current in excess of the threshold value and processes information coming from the current detector to regulate an output impedance value of the output buffer. The current detector includes a duplicated structure which replicates a portion of the buffer circuit without altering the performances of the buffer itself.

20 Claims, 11 Drawing Sheets

FIG. 5A
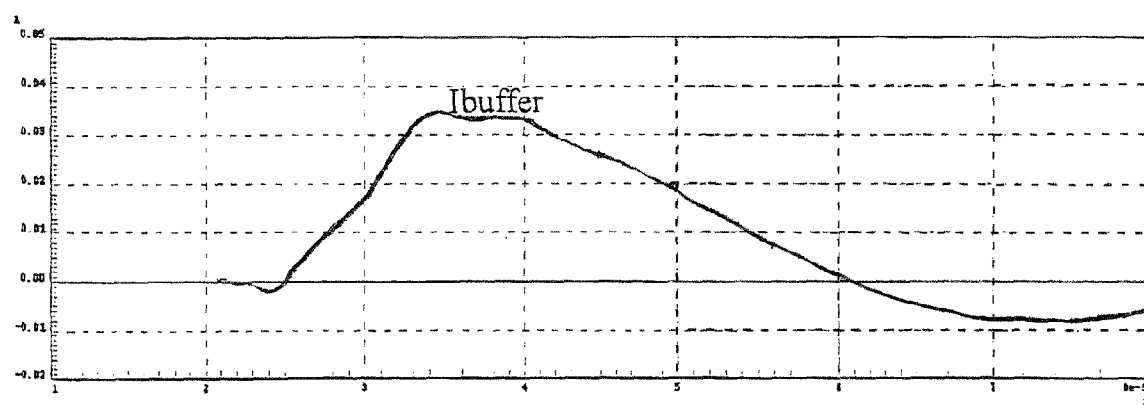
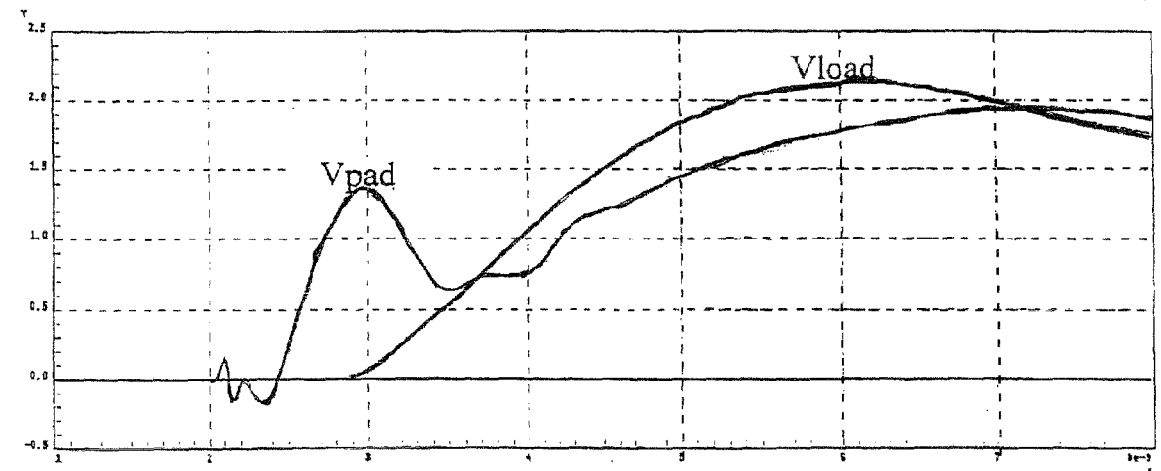
FIG. 5B

OUTPUT BUFFER

PRIORITY CLAIM AND CROSS-REFERENCE TO RELATED APPLICATIONS

The present application is a divisional of U.S. patent application Ser. No. 11/638,321, filed Dec. 13, 2006, now U.S. Pat. No. 7,463,051 which claims priority from European Patent Application No. 05425900.7, filed Dec. 21, 2005, the disclosure of which is hereby incorporated by reference.

BACKGROUND OF THE INVENTION

1. Technical Field of the Invention

The present invention relates to an output buffer.

More specifically, the invention relates to an output buffer of the type comprising at least a first and a second stage, formed by respective first transistors and second transistors inserted, in series with each other, between a first and a second voltage reference and having common conduction terminals connected to an output terminal of said output buffer, having in turn an input terminal connected to control terminals of said transistors of said first stage through an open loop driving circuit.

The invention also relates to a current detector of an electronic device portion.

2. Description of Related Art

As is well known, output buffers play a more and more important role in reaching the requested performances of integrated devices.

The characteristics with which these buffers are designed in fact determine the times necessary for switching of an outputting datum and the so called drivable maximum capacitive fan out of the device.

On the other hand, the increase of the operation frequencies of integrated devices implies that the interconnections have no more negligible lengths and the propagation times can be compared to those ones peculiar to data switchings, making it necessary to consider the problems linked to the reflections and complicating the output buffer designs.

In particular, if the switches of digital signals transmitted on an interconnection are to be optimized (and thus their switching times are to be minimized) it is necessary to design output buffers able to realize an impedance adaptation.

Moreover, due to the non-ideality of the supply interconnections ground bounce phenomena can occur linked to the quickness with which these buffers are able to supply current.

All the considerations made highlight the importance of optimized solutions for output buffers.

To understand the problems involved, it is suitable to simplify the analysis of an output buffer by means of a model comprising the necessary interconnections, which cannot be considered ideal any more.

In its essential form, an integrated device output buffer can, in a first approximation, be patterned as a voltage generator having, in series, an equivalent resistance. This latter parameter represents the buffer output impedance during a transient.

By using for example the conditions expressed by Sanjay Dabral and Timothy J. Maloney in the article entitled: "Basic ESD and I/O design", ed. Wiley Interscience, the disclosure of which is hereby incorporated by reference, and thus considering track lengths being much lower than a minimum value lmin, the interconnection between a buffer and a load can be treated as a network with concentrated parameters R L C, where C is a load capacity, R is the resistance of a track and L its inductance.

It is suitable to remark that the above indicated simplifications however lead to obtaining valid results which are extendible also in the most general case of tracks which do not meet the previously expressed condition.

It is immediate to verify that, during a transition of a datum in the buffer, a reduction of the equivalent resistance implies: a decrease of the datum transition time (indicated as t10-90); a shift of the poles from real to complex conjugated of the transfer function of the buffer; an increase of the imaginary part of these poles; a decrease of the buffer damping factor; and an increase of the over and under elongations of a voltage signal at an output terminal of the buffer.

The main consequence of this behavior is an excessive supply and/or absorption, by the buffer, of current being useless to the datum transition purposes.

It is also theoretically possible that the oscillation of the output voltage signal causes an equivocalness of the datum transmitted by the buffer if it is higher than a logic threshold value.

The above cited phenomena take an increasing importance as the frequencies increase. To ensure shorter and shorter switching times for an output buffer it is thus substantially necessary to increase the current supplied by the buffer itself and thus reduce its equivalent output resistance.

Also the increase of the parasite elements (L C) being both on the output line and on the supply reference implies the accentuation of the oscillatory phenomena of the output voltage signal.

On the contrary an increase of the equivalent resistance during a transition implies: an increase of the datum transition time (indicated with t10-90); an increase of the buffer damping factor; and a decrease and, under suitable conditions (real poles), elimination of the over and under elongations of the buffer output voltage signal.

In other words, to optimize the electric performances of the buffer, it is necessary to minimize the datum transition time and to eliminate the over/under elongations of its output voltage signal.

A behavior of this kind can be obtained by varying the output resistance of the buffer itself. In particular, at the beginning of the transition the impedance must be maintained as small as possible so as to supply the maximum current being the voltage the same, while at the end of the transient the buffer must have such an impedance as to dampen the oscillations.

Different circuit solutions are known to obtain the above indicated "ideal" behavior.

In particular, circuit architectures are proposed which, by means of a feedback control loop, control the impedance of the output buffer thus limiting the oscillations both on the supply references and on the output terminals.

Examples of buffers realized by using such a feedback control loop are described for example in the following articles (the disclosures of which are incorporated by reference): Shyh-Jye Jou, Shu-Hua Kuo, Jui-Ta Chiu and Tin-Hao Lin, "Low switching noise and load-adaptative output buffer design techniques", IEEE J. Solid-State Circuits, vol. 36, no. 8, August 2001, pp. 1239-1249; L. Carro and L. J. Bego, "Low ringing I/O buffer design", Circuits and Systems, 1998. ISCAS '98. Proceedings of the 1998 IEEE International Symposium on Volume 2, May 31-Jun. 3, 1998 pp. 57-60 vol. 2; and E. Chioffi, F. Maloberti, G. Marchesi and G. Torelli, "High-speed, low-switching noise CMOS memory data output buffer", IEEE J. Solid-State Circuits, vol. 29, no. 11, November 1994, pp. 1359-1365.

An operation scheme of an output buffer 1 realized by using a feedback control loop, such as in the above cited documents, is schematically shown in FIG. 1.

In particular, the output buffer 1 has an input terminal DATA receiving a datum to be transmitted and an output terminal PAD whereon there is a transmitted datum. The output buffer 1 comprises a final stage formed by a first and a second transistor TI, T2, inserted, in series with each other, between a first and a second voltage reference, in particular, the supply voltage reference Vcc and the ground GND.

The transistors T1 and T2 are MOS transistors, respectively of the P and N type, having respective gate terminals connected to a first and a second output terminal of a block 2 comprising, in a known way, a combinatory logic and a pre-buffer. The transistors T1 and T2 are also connected, in correspondence with the common drain terminals, to the output terminal PAD of the output buffer 1.

Finally, the block 2 has a first input terminal connected to the input terminal DATA of the output buffer 1 as well as a second input terminal feedback connected to the output terminal PAD of the output buffer 1, thus creating the desired feedback control loop, indicated with 3.

In particular, thanks to the circuit configuration shown, the output voltage Vpad of the buffer (voltage on the output terminal PAD, also simply called pad voltage) is squared with one or more inverted and compared, through several logic gates, with a signal at the input terminal DATA to establish where exactly in the transient the output buffer 1 is located. Thanks to this information, the impedance of the output buffer 1 and consequently its capacity of supplying current are thus regulated, this regulation being performed by the block 2.

Architectures of this kind are efficient until the signal measured has a monotonous progress, so that the switching threshold is crossed by the transition only once.

This condition however fails when the frequencies at issue make sure that the effects of the reflections on the load make the measured voltage non monotonous.

By using a patterning scheme of the output buffer 1, of its supply network 4 and of a load 5 connected thereto as shown in FIG. 2 (being Ra=0.1 W, La=2 nH, Z0=70 W, Td=0.2 ns and Cload=30 pF) it is possible to perform a simulation of a transient. The progresses are thus obtained of the output voltage signals Vpad on the terminal PAD and Vload on the load shown in FIG. 3 during a transition 0→1.

It is clear that an output voltage signal Vpad having the progress shown in FIG. 3 cannot be efficiently used in a control system as previously said.

In fact, if the load is of capacitive nature, and therefore if it behaves as a short circuit on the front of the datum to be transmitted, the output buffer 1 must have the opportunity to react with the maximum power at the reflection arrival. If the feedback control loop 3 acts by means of a comparison between the output voltage Vpad and a threshold, as in the prior art described in the above cited articles, then an output voltage signal Vpad as the one shown in FIG. 3 (corresponding to a real situation) could cause an anticipated increase of the output impedance with subsequent reduction of the current supplied by the output buffer 1. This implies an increase of the times peculiar of the data switching.

Moreover, since the feedback control loop 3 has an intrinsic delay, a situation in which the output buffer 1 operates exactly in opposition of phase with respect to what provided under "ideal" conditions could theoretically occur. In so doing dangerous oscillations of the output voltage signal Vpad could be triggered.

To overcome the problem of the sensitivity to the non monotony of the output voltage Vpad during the transient, the use is also known of a circuit 6 with hysteresis as a feedback element of the feedback control loop 3, as schematically shown in FIG. 4 and as described for example in above cited the article by Shyh-Jye Jou et al.

The introduction of such a circuit 6 with hysteresis is however substantially inefficient. In fact, to obtain a control which is non-sensitive to possible oscillations of the output voltage Vpad on the terminal PAD it is necessary to make the hysteresis cycle of the circuit 6 wide, the circuit thus reacting late and not bringing any benefit.

In particular, making reference to the progress of the output voltage Vpad on the terminal PAD shown in FIG. 3, it can be immediately deduced that the hysteresis cycle of the circuit 6 with hysteresis should be so wide as not to consider as significant the peak of 1.4V which occurs with time 3 ns. Consequently the circuit 6 with hysteresis could be triggered only with time 5 ns when the output voltage Vpad on the terminal PAD have exceeded 1.4V; in this case, however, the level of the voltage Vload on the capacitive load is by this time at a level corresponding to the high supply reference (+1.8V). Such a late intervention could not bring significant improvements of the over-elongations of the output voltage signal Vload.

In substance, the output buffers realized according to the prior art have the problem of the over/under elongations of the voltage signal Vload on a load connected thereto, essentially due to the parasite elements linked to the interconnections between the output terminal and the load and the proposed solutions using a feedback in voltage are inefficient since the voltage signal Vpad is irregular.

There is accordingly a need in the art for providing an output buffer able to reduce the over/under elongations of its output voltage signal optimizing in this way the transition time of the output terminal itself and overcoming the limits and drawbacks still affecting the buffers realized according to the prior art.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 5A-5B schematically show the progress of voltages and currents inside an output buffer;

DETAILED DESCRIPTION OF THE DRAWINGS

The present invention is based on the use of a double feedback, in voltage and in current. In particular, an output buffer is proposed with regulation of an output impedance value based on the detection of an output voltage signal Vpad on an output terminal PAD, and of a current Ibuffer supplied/drawn by the buffer itself to make the buffer thus obtained insensitive to the effects of the reflections and at the same time quick.

In particular, the present invention starts from the observation that the progress of the current Ibuffer is much more regular than the one of the output voltage Vpad, as schematically shown in FIGS. 5A and 5B. In other words, the measure of the current Ibuffer is more suitable to be used as value for the comparison with a threshold value.

The explanation of this phenomenon is to be searched in the inductive component of the interconnection between the terminal PAD and a load connected to the output buffer imposing the continuity and the regularity of the current Ibuffer.

Figure 6:
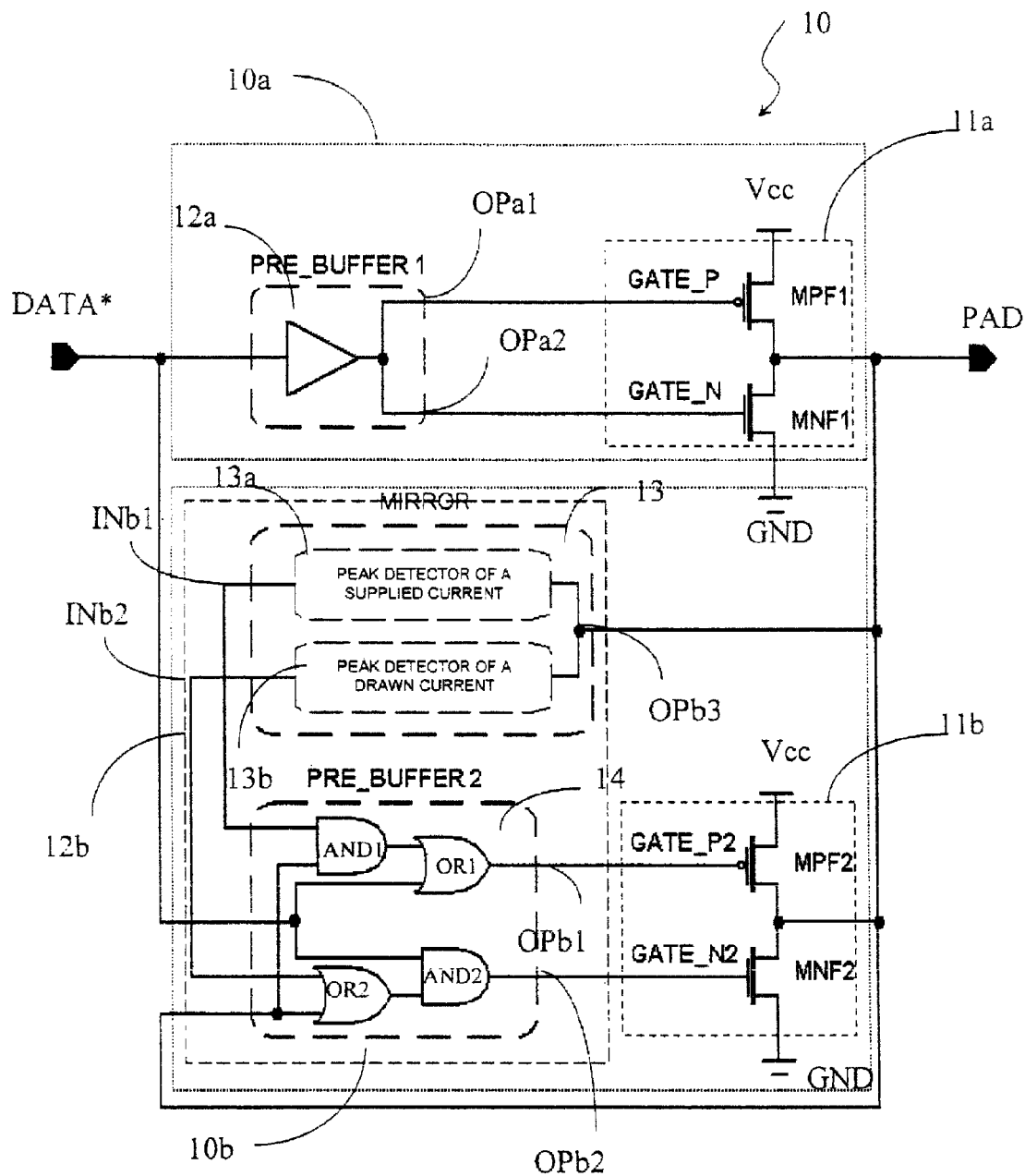
FIG. 6 schematically shows a principle scheme of an output buffer realized according to the invention.

With reference to FIG. 6, an output buffer is then described being realized according to the present invention, globally and schematically indicated with 10.

The output buffer 10 comprises a first 11a and a second final stage 11b, formed by respective first MOS transistors of the P type, MPF1 and MPF2, and second MOS transistors of the N type, MNF1 and MNF2, inserted, in series with each other, between a first and a second voltage reference, respectively a supply voltage reference Vcc and a ground GND and having conduction terminals, in particular common drain terminals connected to an output terminal PAD of the output buffer 10.

Advantageously according to the invention, the first and the second final stage 11a and 11b are respectively driven in open loop and in feedback.

In this way, the output buffer 10 comprises a first open loop driving block 10a, in turn including the first final stage 11a and a first driving circuit 12a, as well as a second feedback driving block 10b, in turn including the second final stage 11b and a second driving circuit 12b.

Moreover, advantageously according to the invention, the second driving circuit 12b comprises a current detector 13, suitable to detect a maximum value in the current drawn by and supplied to the output buffer 10, and a comparison block 14 with a threshold value, suitable to detect an excess of a threshold value (in particular equal to the output voltage value of half the voltage-swing Vcc/2) and to process information coming from the current detector 13 to regulate an output impedance value of the output buffer 10 itself.

As it will be clear hereafter in the description, the operation of the output buffer 10 is the following one.

To perform a transition of the terminal LOAD (corresponding to the load) connected to the output terminal PAD from the bottom to the top, the first transistors MNF1 and MNF2 are first turned off and subsequently the second transistors MPF1 and MPF2 of the final stages 11a and 11b are turned on, so as to eliminate possible cross-bar currents and useless dissipations. Hereafter in the description, for sake of simplicity, reference will be indistinctly made to the terminals and to the voltage signals present thereon by indistinctly using the references LOAD, PAD and DATA*.

When the output terminal PAD exceeds half dynamics (Vcc/2) and the value of the current Ibuffer supplied by the output buffer 10 has reached a maximum value Imax, the second transistor MPF2 of the second final stage 11b is turned off to increase the impedance of the output buffer 10 and thus dampen the oscillations of the signal on the output terminal LOAD.

Subsequently, the second transistor MPF2 of the second final stage 11b is turned on again.

To realize a transition of the output terminal PAD from the top to the bottom the behavior of the output buffer 10 is dual (i.e., opposite that described above).

Figures 7A, 7B, 7C:
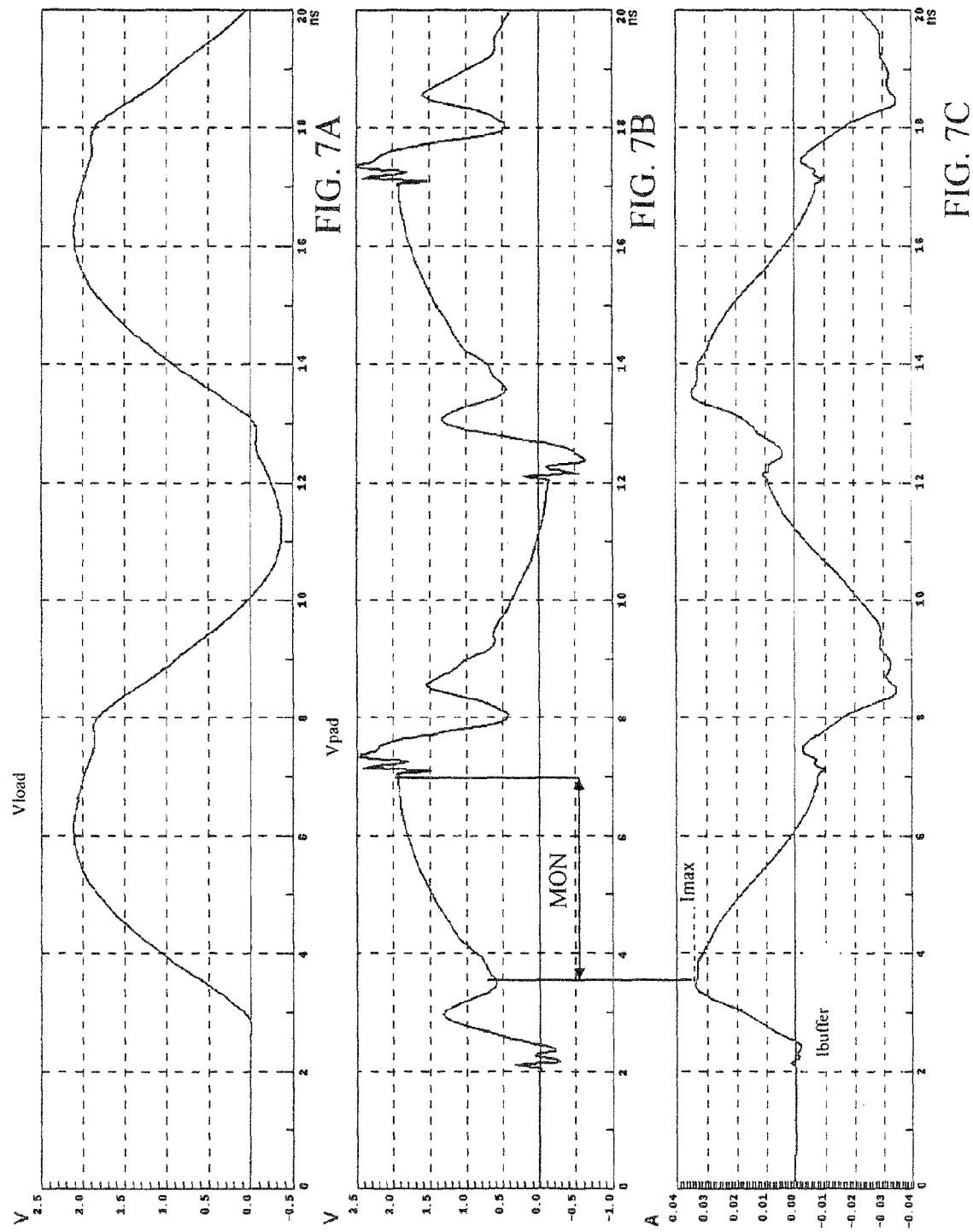
FIGS. 7A-7C schematically show the progress of voltage signals and currents inside the buffer of FIG. 6.

This requested behavior the output buffer 10 is based on the consideration that the output voltage signal Vpad is monotonous for a range MON after that the output current Ibuffer has reached the maximum value Imax, as shown in FIGS. 7A-7C.

Let's now see, in greater detail, the circuit architecture of the output buffer 10.

In particular, the first driving circuit 12a has an input terminal connected to an inverted input terminal, DATA*, as well as a first output terminal OPa1 and a second output terminal OPa2 connected to respective control terminals, in particular the gate terminals, of the transistors MPF1 and MNF 1 of the first final stage 11 a.

Figure 8:
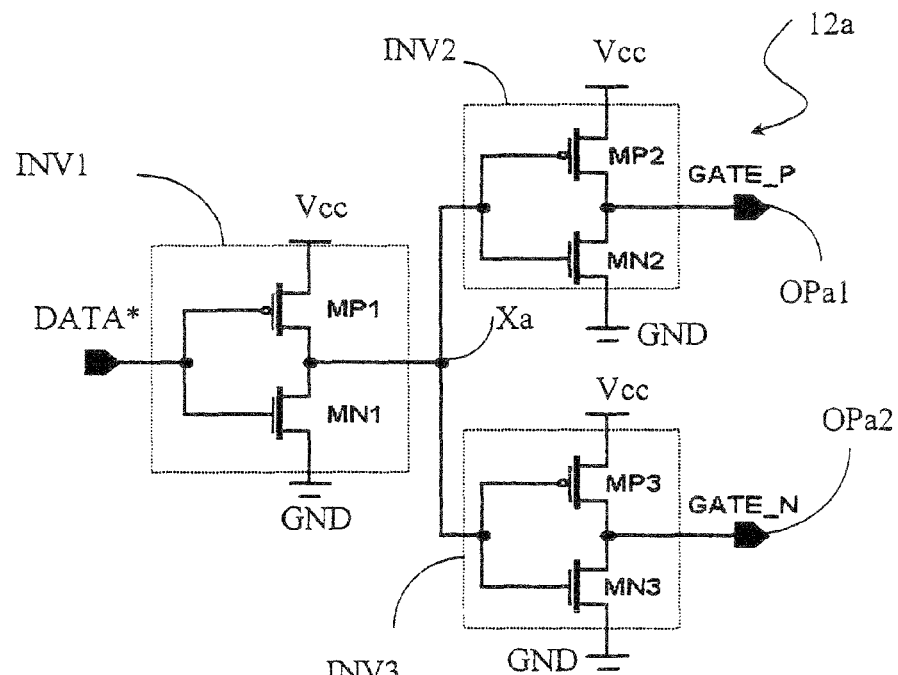
FIG. 8 shows in greater detail a driving circuit comprises in the buffer of FIG. 6.

This first driving circuit 12a essentially comprises three inverters, INV1, INV2 and INV3, inserted between the supply terminal reference Vcc and the ground GND and connected to the input terminal DATA* of the output buffer 10 and to the gate terminals of the transistors MPF1 and MNF1 of the first final stage 11a to generate a first GATE_P and a second driving signal GATE_N for these transistors MPF1 and MNF1, as schematically shown in FIG. 8.

In particular, the first inverter INV1 comprises a first and a second MOS transistor, MP1 and MN1, respectively of the P type and of the N type, having gate terminals connected to each other and to the input terminal DATA* of the output buffer 10 and common drain terminals connected to an inner circuit node Xa. In substance, the first transistor MP1 is a pull-up transistor and the second transistor MN1 is a pull-down transistor.

Similarly, the second inverter INV2 comprises a first and a second MOS transistor, MP2 and MN2, respectively of the P and of the N type, having gate terminals connected to each other and to the inner circuit node Xa and common drain terminals connected to the first output terminal OPa1. As previously seen, the first transistor MP2 is a pull-up transistor and the second transistor MN2 is a pull-down transistor.

Finally, the third inverter INV3 comprises a first and a second MOS transistor, MP3 and MN3, respectively of the P and of the N type, having gate terminals connected to each other and to the inner circuit node Xa and common drain terminals connected to the second output terminal OPa2. Also in this case, the first transistor MP3 is a pull-up transistor and the second transistor MN3 is a pull-down transistor.

In this way, the first driving circuit 12a supplies, on the output terminals OPa1 and OPa2, the driving signals, GATE-P and GATE-N for the transistors MPF1 and MNF1 of the first final stage 11a according to an open loop driving.

Advantageously, the second inverter NV2 comprises transistors MP2 and MN2 which are sized so that the signal generated on the first output terminal OPa1 is quicker in performing transition upwards than downwards. Moreover, advantageously according to the invention, the sizing of the transistors MP3 and MN3 of the third inverter INV3 is such as to obtain an opposite behavior with respect to the one of the second inverter INV2.

This asymmetry in the behaviors of the two inverters NV2 and INV3 allows to eliminate crow-bar currents in the transistors MPF1 and MPF2 of the first final stage 11a.

Figure 9:
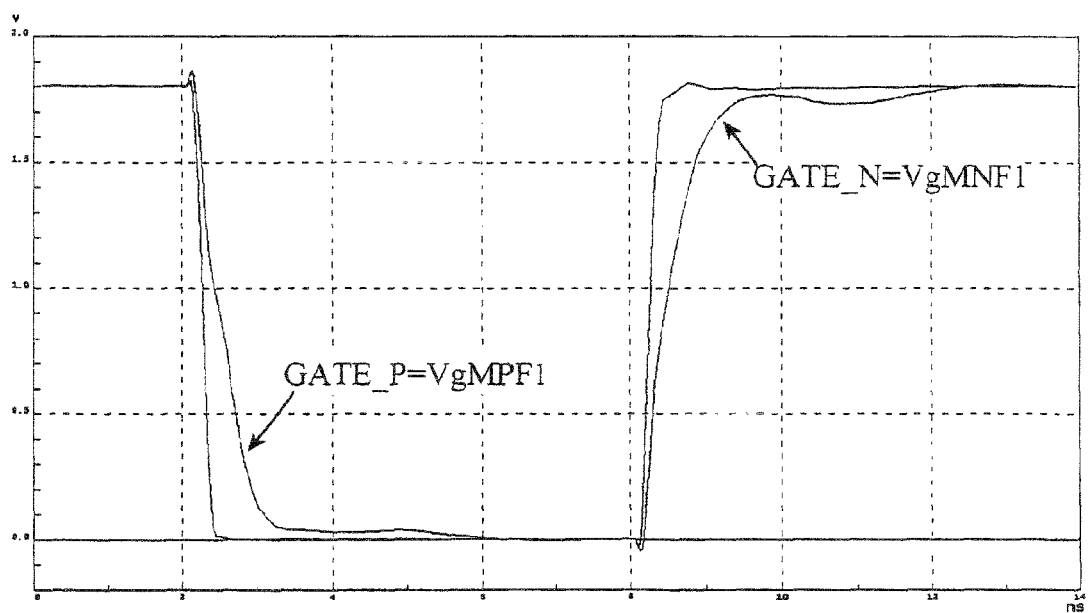
FIG. 9 schematically shows the progress of voltages inside the portion of FIG. 8.

In fact observing the timing progress of the voltage values of the driving signals GATE_P and GATE_N generated by the second INV2 and by the third inverter INV3, as shown in FIG. 9, and considering that a turn-on threshold value of the MOS transistors, both of the P and of the N type is equal to about 0.6V, it is clear that the pull-up transistor and the pull down one of these inverters are never simultaneously turned on.

As regards the second driving circuit 12b, it comprises, as above briefly indicated, a current detector 13 and a comparison block 14 to realize a feedback driving, as it will be clearer hereafter in the description.

Figure 10:
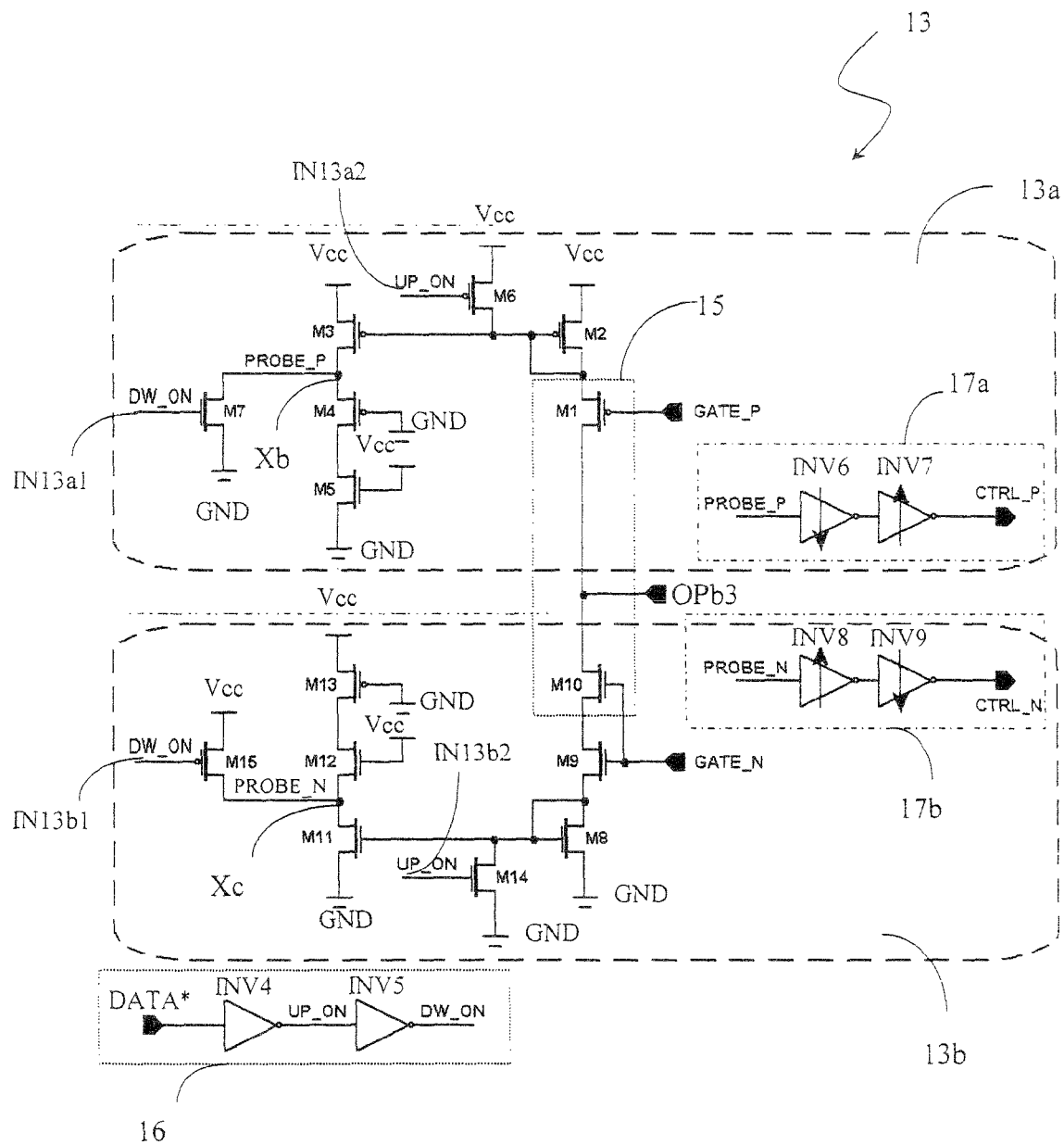
FIG. 10 shows in greater detail a current detector realized according to the invention and comprised in the buffer of FIG. 6.

In particular, advantageously according to the invention, a current detector 13 is proposed which is not directly connected to the transistors of the first final stage 11a, but comprises a structure suitable to "replicate" this final stage, as shown in greater detail in FIG. 10.

In fact, it should be noted that it is not possible to directly measure the current supplied by the output buffer 10 without altering the performances thereof, since it would be necessary to introduce a structure of the current mirror type or a detecting resistance directly on the transistors of the first final stage 11a, which would imply a remarkable area occupation and a slowdown of the switching times. Advantageously according to the invention a circuit block 15 has thus been introduced copying the structure of the first final stage 11a and comprising a first duplicated transistor M1 and a second duplicated transistor M10, respectively of the P and of the N type, as shown in FIG. 10.

Suitably, these duplicated transistors M1 and M10 have remarkably smaller sizes with respect to the transistors MPF1 and MNF1 of the first final stage 11a and receive, on the gate terminals, the driving signals GATE_P and GATE_N. The duplicated transistors M1 and M10 also have common drain terminals connected to an output terminal OPb3 of the current detector 13, in turn connected to the output terminal PAD of the output buffer 10.

In substance, the current detector 13 carries out a current measure on this circuit block 15 by means of a current mirror configuration. In particular, the current detector 13 detects the attainment of a maximum value Imax of the current Ibuffer supplied to or drawn by the duplicated transistors M1 and M10 instead of the transistors MPF1 and MNF1 of the first final stage 11a.

In particular, the current detector 13 comprises a first detector 13a of a supplied current, in turn including the first duplicated transistor M1, and a second detector 13b of a drawn current, in turn including the second duplicated transistor M10

Making reference to FIG. 10, the first detector 13a of a supplied current has a first input terminal IN13a1 receiving a first triggering signal DW_ON, and a second input terminal IN13a2 receiving a second triggering signal UP_ON, these triggering signals being suitably generated by a first generator 16.

In particular, the first generator 16 comprises a first INV4 and a second inverter INV5 in cascade to each other and connected to the input terminal DATA* of the output buffer 10. The first inverter INV4 outputs the second triggering signal UP_ON, while the second inverter INV5 outputs the first triggering signal DW_ON.

Advantageously, the first detector 13a of a supplied current comprises a current mirror realized by means of a first and a second mirror transistor, M2 and M3, connected to the supply voltage reference Vcc, as well as to the first duplicated transistor M1 and to a first inner circuit node Xb. In particular, the first mirror transistor M2, being diode-configured, is inserted between the supply voltage reference Vcc and a source terminal of the first duplicated transistor M1 and it has a gate terminal connected to the gate terminal of the second mirror transistor M3, in turn inserted between the supply voltage reference Vcc and the first inner circuit node Xb.

The first inner circuit node Xb is in turn connected, by means of a first triggering transistor M7, to the ground GND, this first triggering transistor M7 having a gate terminal receiving the first triggering signal DW_ON.

The first detector 13a of a supplied current also comprises a second triggering transistor M6 inserted between the supply voltage reference Vcc and the common gate terminals of the mirror transistors M2 and M3 and having in turn a gate terminal receiving the second triggering signal UP_ON.

At the first inner circuit node Xb there is a first inner voltage signal PROBE_P.

This first inner circuit node Xb is also connected to the ground GND by means of the series of a first and of a second biasing transistor, M4 and M5, having gate terminals connected respectively to the ground GND and to the supply voltage reference Vcc.

The first detector 13a of a supplied current finally comprises a second generator 17a, in turn including a first INV6 and a second inverter INV7 in cascade to each other and connected to the first inner circuit node Xb to output a first control signal CTRL_P.

In a dual way, the second detector 13b of a drawn current has a first input terminal IN13b1 receiving the first triggering signal DW-ON, and a second input terminal IN13b2 receiving the second triggering signal UP_ON, these triggering signals being suitably generated by the first generator 16.

Advantageously, the second detector 13b of a drawn current comprises a current mirror realized by means of a first and a second mirror transistor, M8 and M11, connected to the supply voltage reference, as well as to the second duplicated transistor M10 and to a second inner circuit node Xc. In particular, the first diode configured mirror transistor M8 is inserted between a further input transistor M9, in turn connected to the second duplicated transistor M10, and the ground GND and it has a gate terminal connected to the gate terminal of the second mirror transistor M11, in turn inserted between the second inner circuit node Xc and the ground.

The second input transistor M9 is inserted between the second duplicated transistor M10 and the first mirror transistor M8 and it has a gate terminal connected to the gate terminal of the second duplicated transistor M10, both receiving the second driving signal GATE_N.

The second inner circuit node Xc is in turn connected, by means of a first triggering transistor M15, to the supply voltage reference Vcc. The first triggering transistor M15 has a gate terminal receiving the first triggering signal DW_ON.

The second detector 13b of a drawn current also comprises a second triggering transistor M14 inserted between the common gate terminals of the mirror transistors M8 and M11 and the ground GND and having in turn a gate terminal receiving the second triggering signal UP_ON.

At the second inner circuit node Xc there is a second inner voltage signal PROBE_P.

The second inner circuit node Xc is also connected to the supply voltage reference Vcc by means of the series of a first and of a second biasing transistor, M13 and M12, having gate terminals respectively connected to the ground GND and to the supply voltage reference Vcc.

The second detector 13b of a drawn current finally comprises a third generator 17b, in turn including a first INV8 and a second inverter INV9 in cascade to each other and connected to the second inner circuit node Xc to output a second control signal CTRL_N.

In substance, the current detector 13 according to the invention can be used in all those applications wherein it is not suitable or possible to carry out a direct measure of the current supplied/drawn by a device circuit portion. In fact, the current detector 13 allows to carry out "from the outside" an evaluation of this supplied/drawn current by means of a "duplicated" structure, such as the circuit block 15 which, in the case considered of an output buffer, duplicates the structure of a final stage.

Advantageously according to the invention, the first and the second control signal, CTRL_P and CTRL_N, are used by the comparison block 14.

Making reference to FIG. 6, the comparison block 14 essentially comprises the cascade of a first logic gate of the AND type, AND1, and of a second logic gate of the type OR, OR1, connected between the first detector 13a of a supplied current and the gate terminal of the first transistor MPF2 of the second final stage 11 by as well as the cascade of a third logic gate of the OR type, OR2, and of a fourth logic of gate of the AND type, AND2, connected between the second detector 13b of a drawn current and the gate terminal of the second transistor MNF2 of the second final stage 11 b.

In particular, the first logic gate AND1 has a first input terminal connected to the first detector 13a of a supplied current and a second input terminal connected to a second input terminal of the third logic gate OR2, as well as an output terminal connected to a first input terminal of the second logic gate OR1 having in turn a second input terminal connected to a first input terminal of the fourth logic gate AND2 and an output terminal connected to the gate terminal of the first transistor MPF2 of the second final stage 11b.

The third logic gate OR2 has a first input terminal connected to the second detector 13b of a drawn current and an output terminal connected to a second input terminal of the fourth logic gate AND2 having in turn an output terminal connected to the gate terminal of the second transistor MNF2 of the second final stage 11b.

Moreover, the second input terminal of the second logic gate OR1 and the first input terminal of the fourth logic gate AND2 are connected to each other and to the input terminal DATA* of the output buffer 10. Finally, the second input terminal of the third logic gate OR2 and the second input terminal of the first logic gate AND1 are connected to each other and to the output terminal PAD of the output buffer 10.

Figure 11:
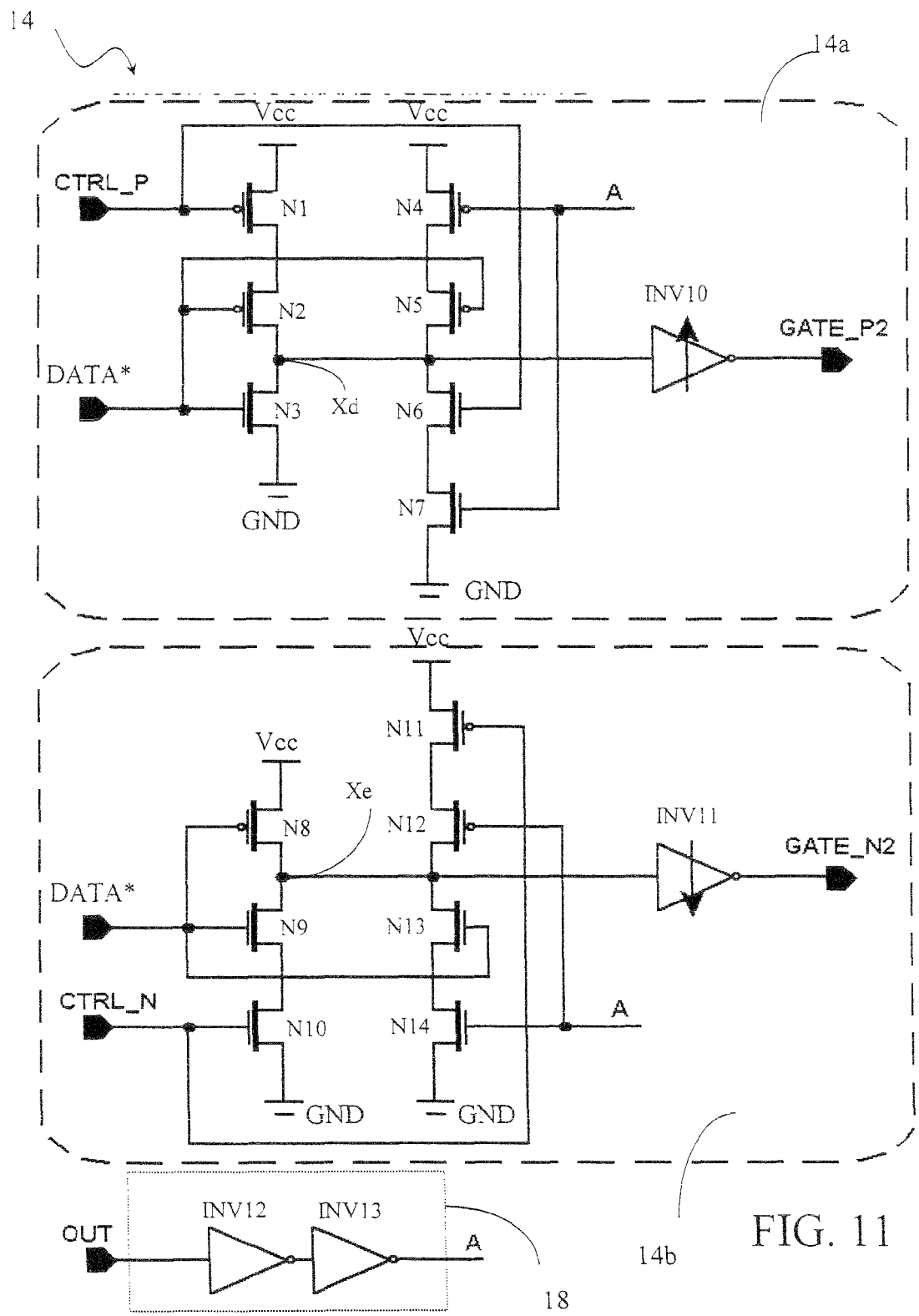
FIG. 11 shows in greater detail a comparison block in the buffer of FIG. 6.

In substance, the first and second logic gates, AND1 and OR1, form a first portion 14a of the comparison block 14, while the third and fourth logic gates, OR2 and AND2 form a second portion 14b of the comparison block 14, as shown in greater detail in FIG. 11.

The first portion 14a comprises the series of a first N1, a second N2 and a third transistor N3 inserted between the supply voltage reference Vcc and ground GND. In particular, the first transistor N1 has a gate terminal receiving the first control signal CTRL_P, while the second and third transistors, N2 and N3, are interconnected in correspondence with a first inner circuit node Xd and they have common gate terminals connected to the input terminal DATA* of the output buffer 10.

The first portion 14a also comprises the series of a fourth N4, a fifth N5, a sixth N6 and a seventh transistor N7 inserted between the supply voltage reference Vcc and ground GND. In particular, the fourth transistor N4 has a gate terminal connected to a control terminal A, the fifth transistor N5 has a gate terminal connected to the common gate terminals of the second transistor N2 and of the third transistor N3, the sixth transistor N6 has a gate terminal connected to the gate terminal of the first transistor N1 and receiving the first control signal CTRL_P, while the seventh transistor N7 has a gate terminal connected to the control terminal A.

The fifth transistor N5 and the sixth transistor N6 are interconnected to each other in correspondence with the first inner circuit node Xd, in turn connected, by means of a first inverter INV10 to the gate terminal of the first transistor MPF2 of the second final stage 11b and supplying it with a first control signal GATE_P2.

Similarly, the second portion 14b comprises the series of an eighth N8, a ninth N9 and a tenth transistor N10 inserted between the supply voltage reference Vcc and ground GND. In particular, the eighth transistor N8 and the ninth transistor N9 are interconnected in correspondence with a second inner circuit node Xe and they have common gate terminals connected to the input terminal DATA* of the output buffer 10, while the tenth transistor N10 has a gate terminal receiving the second control signal CTRL_N.

The second portion 14b also comprises the series of an eleventh N11, a twelfth N12, a thirteenth N13 and a fourteenth transistor N14 inserted between the supply voltage reference Vcc and ground GND. In particular, the eleventh transistor N11 has a gate terminal connected to the gate terminal of the tenth transistor N10 and receiving the second control signal CTRL_N, the twelfth transistor M12 has a gate terminal connected to the gate terminal of the fourteenth transistor M14 and to the control terminal A, while the thirteenth transistor N13 has a gate terminal connected to the common gate terminals of the eighth transistor N8 and of the ninth transistor N9.

The twelfth transistor N12 and the thirteenth transistor N13 are interconnected to each other in correspondence with the second inner circuit node Xe, in turn connected, by means of a second inverter INV11, to the gate terminal of the second transistor MNF2 of the second final stage 11b and supplying it with a second control signal GATE_N2.

Finally, the comparison block 14 comprises a digitization block 18 connecting the control terminal A to the output terminal PAD and it comprises the cascade of a third INV12 and of a fourth inverter INV13.

Let's now see the operation of the output buffer 10 and of the current detector 13 according to the invention.

In particular, as regards the current detector 13, through the triggering signals UP_ON and DW_ON only one of the current mirrors formed by the transistors M2-M3, respectively and M8-M11 is activated. In particular, these triggering signals UP_ON and DW_ON only activate the mirror necessary for a particular transition the output buffer 10 is requested, the other mirror being placed in a wait state wherein each inner node is maintained at a very precise voltage level.

For sake of simplicity, only the sizing and the operation of the first detector 13a of a supplied current is now analyzed, from which it is possible to deduce, in a dual way, for the sizing and the operation of the second detector 13b of a drawn current.

The first duplicated transistor M1, the mirror transistors M2 and M3 and the first biasing transistor M4 have area equal to a fraction of the first transistor MPF1 of the first final stage 11a, while the second biasing transistor M5 has greater sizes than the previous ones since it only serves to avoid that the first biasing transistor M4 is directly connected to the ground GND, acting, in substance, as protection resistance.

The triggering transistors M6 and M7 maintain the gate terminal of the first mirror transistor M2 at a value equal to the one of the supply voltage reference Vcc and the first inner circuit node Xb (and thus the first inner voltage signal PROBE_P) at the value of the ground GND during the pull-down step. The inverters INV6 and INV7 have the task of regenerating the fronts of the signal and, globally, they make sure that the first control signal CTRL_P has a lower transition time upwards than downwards.

Before the transition the input terminal DATA* of the output buffer 10 is high, the output terminal PAD is low and the gate terminal of the first duplicated transistor M1 (whereat there is the first driving signal GATE_P) is at a value equal to the supply voltage reference Vcc. In this case, the second triggering transistor M6 maintains the gate terminal of the first mirror transistor M2 at the value of the supply voltage reference Vcc, the first triggering transistor M7 maintains the first inner circuit node Xb (whereat there is the first inner voltage signal PROBE_P) at the value of the ground GND, forcing the first control signal CTRL_P and the first driving signal GATE_P to ground GND and to the value of the reference voltage value Vcc, respectively.

The mirror transistors M2 and M3 are active during the transition upwards. In this case, the current read by the first mirror transistor M2 and mirrored through the second mirror transistor M3 is transformed in a voltage through a known impedance constituted by the first biasing transistor M4. The voltage signal thus obtained is compared with a suitable threshold so as to determine the current peak of the current Ibuffer.

When the input terminal DATA* switches from the logic level "1" to the logic level "0", the triggering transistors M6 and M7 turn off making the first detector 13a of a supplied current leave the wait state. Subsequently, the first driving signal GATE_P is lowered by the first driving circuit 12a thus obtaining that both the first transistor MPF1 of the first final stage 11a and the first duplicated transistor M1 conduct current.

The first inner voltage signal PROBE_P at the first inner circuit node Xb begins to increase due to the current mirrored by the transistors M2 and M3 and when the voltage level reaches about half dynamics (i.e. when the current Ibuffer has reached the maximum value Imax) the first control signal CTRL_P is brought to the logic level "1" by the chain of inverters formed by INV3 and INV4.

Subsequently, the current of the first transistor MPF1 of the first final stage 11a decreases as the one of the second mirror transistor M3 and the first inner voltage signal PROBE_P at the first inner circuit Xb decreases. As a consequence, the first control signal CTRL_P is slowly brought to ground GND exceeding half dynamics after that the output terminal PAD of the output buffer 10 has ended its transition.

As already said, similar considerations pertaining to the sizing and to the operation are valid for the second detector 13b of the current drawn by the second duplicated transistor M10 for the second transistor MNF1 of the first final stage 11a.

An important fact to be noted is that the activated mirror comprising the transistors M2 and M3 starts to operate simultaneously with the first final non fed back stage 11a (comprising the transistors MPF1 and MNF1) since the first duplicated transistor M1, the second duplicated transistor M10 and the transistor M9 in series to the second duplicated transistor M10 are driven by the first driving circuit 12 by means of the driving signals GATE_P and GATE_N.

This feature improves the fidelity of the mirroring and it avoids that the second feedback driving block 10b of the output buffer 10 can in some way oppose to the first open loop driving block 10a, thus eliminating possible instability of the system as a whole.

Figure 12:
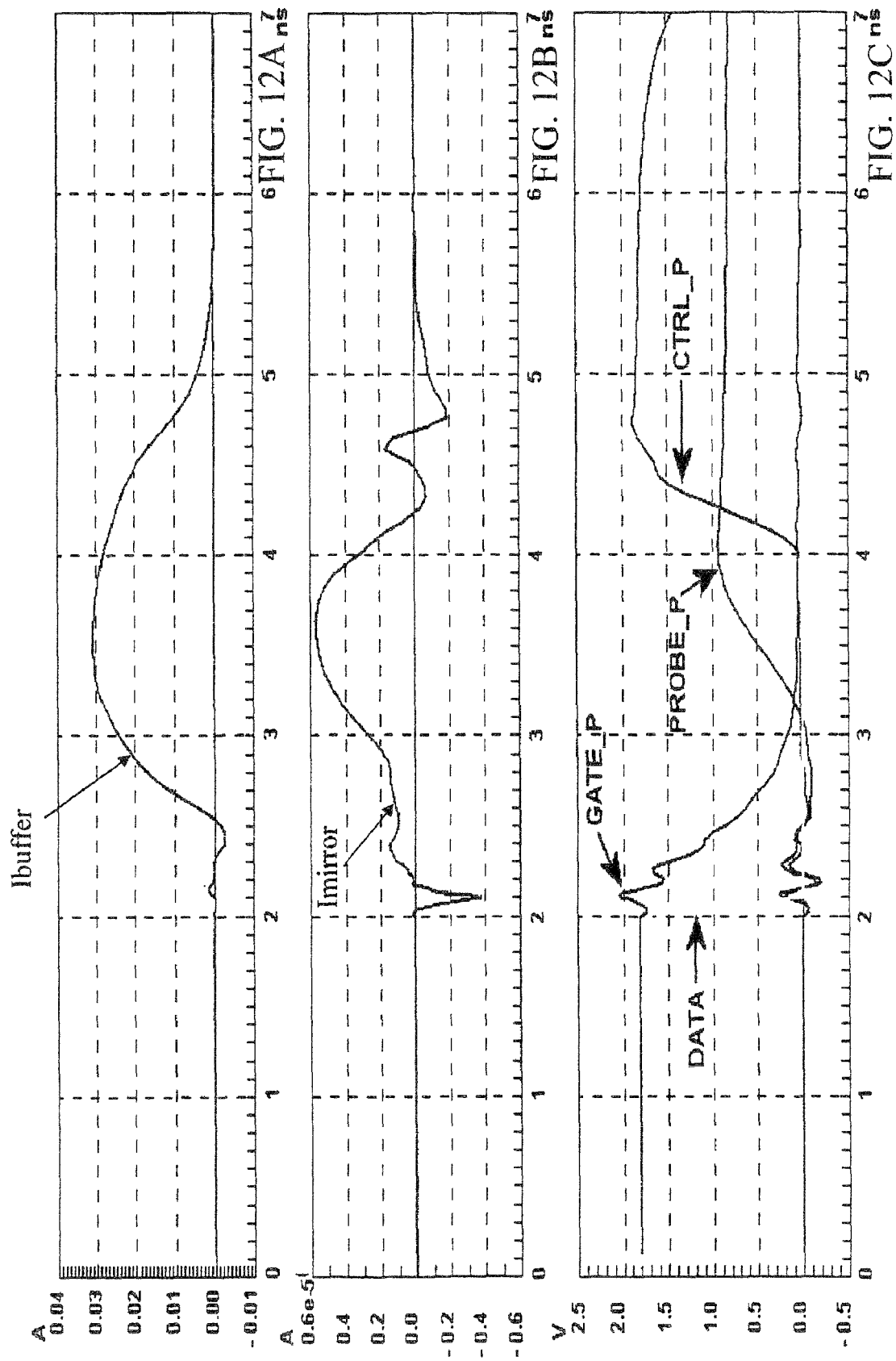
FIGS. 12A-12C schematically show the progress of signals inside the buffer of FIG. 6.

11 FIGS. 12A-12C show the progresses of the current and voltage signals inside the output buffer 10 for a transition of the output 0→1, against a transition of the output terminal PAD from the ground value GND (0V) up to a value of the supply voltage reference Vcc (for example equal to 1.8V).

In particular, FIG. 12A shows the progress of the current Tbuffer supplied by the output buffer 10, FIG. 12B shows the progress of the mirror current Imirror mirrored by the first detector 13a of a supplied current and FIG. 12C shows the progress of the control signals inside the first detector 13a of current supplied of the current detector 13 against a transition on the input terminal DATA of the output buffer 10, in particular the first driving signal GATE_P, the first inner voltage signal PROBE_P and the first control signal CTRL_P.

Finally, the comparison block 14 is used to drive the power MOS transistor of the second final stage 11b, i.e. of the fed back final stage. In particular, the comparison block 14 is input the signal DATA*, i.e. the opposite value of the datum which is to be transferred onto the output terminal PAD of the output buffer 10 and the pad voltage signal at the output terminal PAD of the output buffer 10 necessary for the feedback in voltage, as well as the control signals, CTRL_N, CTRL_P, generated by the current detector 13 and responsible for the feedback in current.

In particular, inside the comparison block 14 the following logic functions are realized:

$$IN\_BUFF\_P2=(\overline{DATA})OR[(CTRL\_P)AND(PAD)]$$

$$IN\_BUFF\_N2=(\overline{DATA})AND[(CTRL\_N)OR(PAD)]$$

being IN_BUFF_P2 and IN_BUFF_N2 the output nodes of the inverters INV10 and INV11 of the comparison block 14 i.e. the gate terminals of the transistors MPF2 and MNF2 of the second final stage 11b.

The two inverters INV10 and INV11 are sized as the respective inverters of the first driving circuit 12a, i.e. the inverters INV2 and INV3 comprising the transistors MP2, MN2 and MP3, MN3 as shown in FIG. 7.

The signal on the output terminal PAD, once re-digitized by the cascade of the two inverters INV12 and INV13, is used as safety signal to allow or not the turn-off of the transistor of the second final stage 11b interested in the transition.

The logic gates of the comparison block 14 are sized to have a propagation delay of the input signal DATA* similar to the one of the first inverter INV1 of the first driving circuit 12a, formed by the transistors MP1 and MN1. In this way at the beginning of a transition the two branches of the output buffer 10 turn on simultaneously.

From simulations carried out by the Applicant, it has been verified how the voltage on a load connected to the output buffer 10 according to the invention has reduced over and under elongations also allowing an improvement of the performances.

It is also suitable to note that the output buffer 10 according to the invention allows to realize a perfect impedance adaptation of the output buffer 10 to a respective transmission line.

In particular, once the impedance value of this transmission line is known, indicated hereafter with Z0, it is possible: to size the first driving block 10a in an open loop configuration (i.e. the non fed back portion of the output buffer 10) so that it has, in the final part of the transient, an output resistance equal to Z0; to size the second driving block 10b in a feedback configuration (i.e. the fed back portion of the output buffer 10) to ensure specifications on the desired transition times; and to change the circuit architecture proposed for the output buffer 10 so that the second driving block 10b in feedback does not turn on again.

With these measures, the initial part of a transition occurs with the output buffer 10 at the maximum power, while the transient is brought to the end with an output resistance equal to Z0 thus dampening all the reflections and consequently the oscillations.

Figure 13:
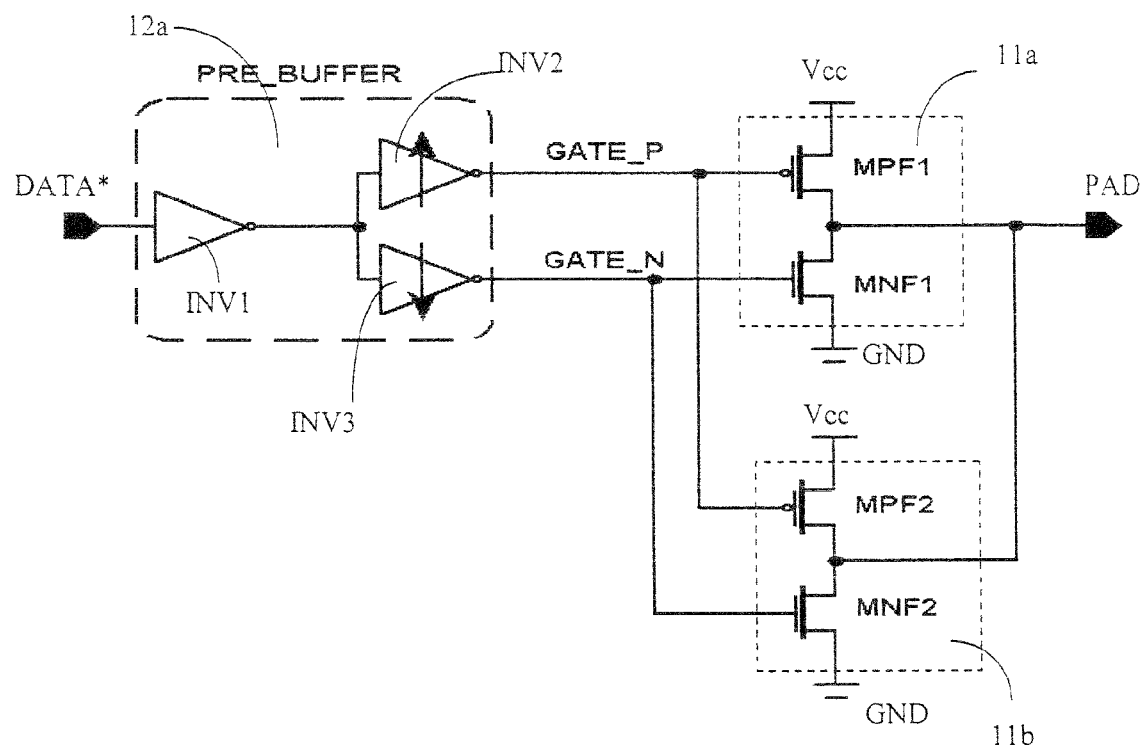
FIG. 13 schematically show a principle scheme of an output buffer realized according to the prior art, represented by using the reference numbers of the output buffer according to the invention shown in FIG. 6.

In particular, for the simulations a non fed back scheme has been used for an output buffer realized according to the prior art and schematically shown in FIG. 13, globally indicated with 1. For an immediate comprehension of this known output buffer 1, structurally and functionally identical elements have been indicated with the same reference numbers used for the output buffer 10 according to the invention.

The output buffer 1 thus comprises a first 11a and a second final stage 11b, formed by respective transistors MPF1, MNF1 and MPF2, MNF2, inserted between the supply voltage reference Vcc and the ground GND and having common drain terminals connected to the output terminal PAD and respective gate terminals connected to a non fed back driving circuit 12a. In turn, the driving circuit 12a comprises the inverters INV1, INV2, INV3, as shown for the output buffer 10 according to the invention with reference to FIG. 8.

The transistors MPF1, MPF2, MNF1 and MFN2 of the final stages 11a and 11b have identical size as the homonymous transistors of the output buffer 10 according to the invention.

Figure 1:
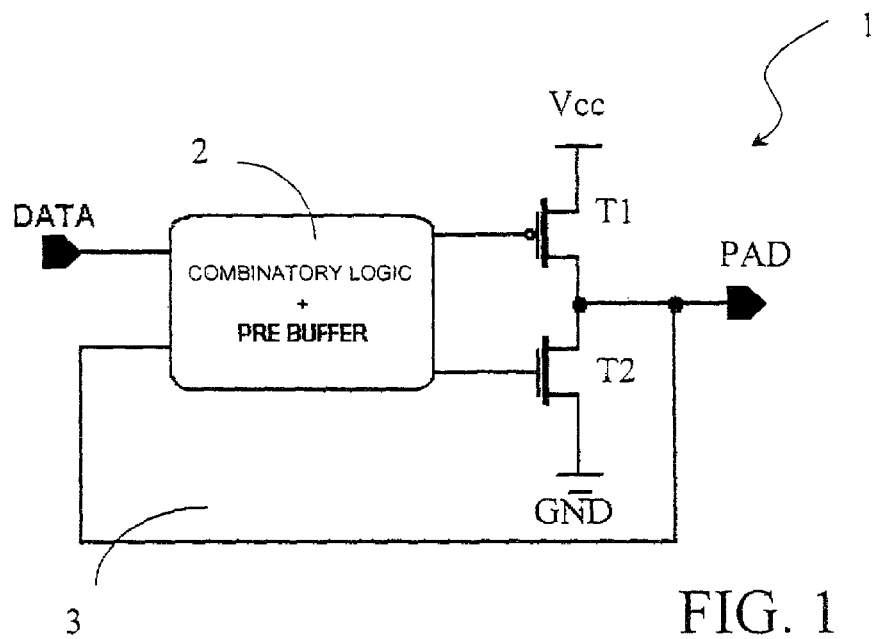
FIG. 1 schematically shows a principle scheme of a buffer with a feedback in voltage realized according to the prior art.
Figure 2:
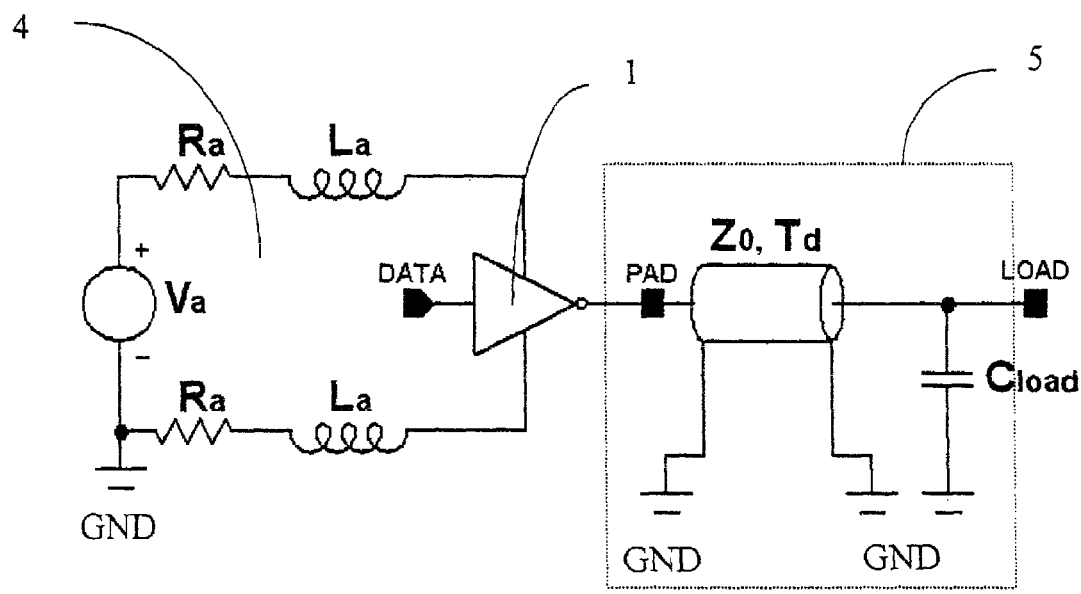
FIG. 2 shows a model of the output buffer of FIG. 1, including its supplies and a load.
Figure 3:
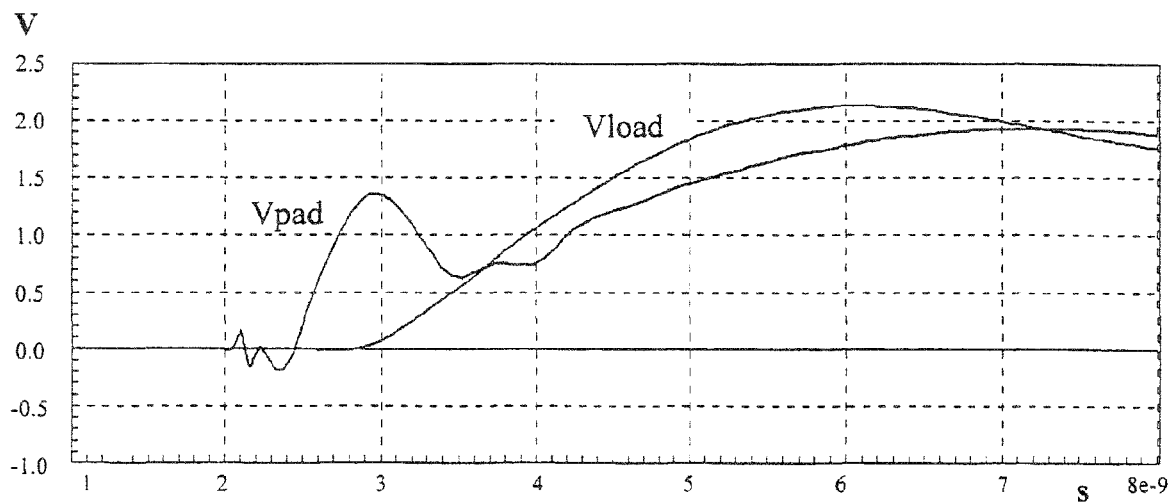
FIG. 3 schematically shows the progress of voltages inside the buffer of FIG. 1.
Figure 4:
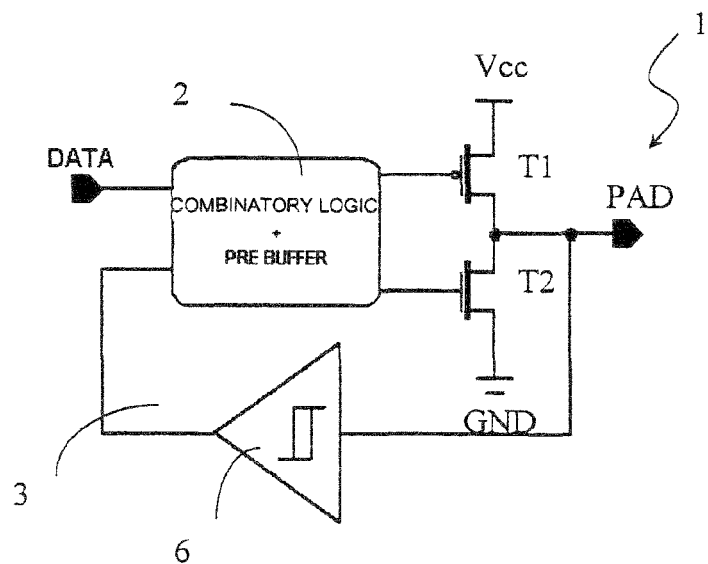
FIG. 4 schematically shows a principle scheme of a buffer with a feedback by a circuit with hysteresis realized according to the prior art.

Moreover, the supply references are modeled as in FIG. 2 with the following value of the parameters: Z0=50 W, Td=0.2 ns, Va=1.8V, Ra=0.1 W, La=2 nH, Cload=30 pF and the transistors have been sized following the above exposed criteria.

Figure 14:
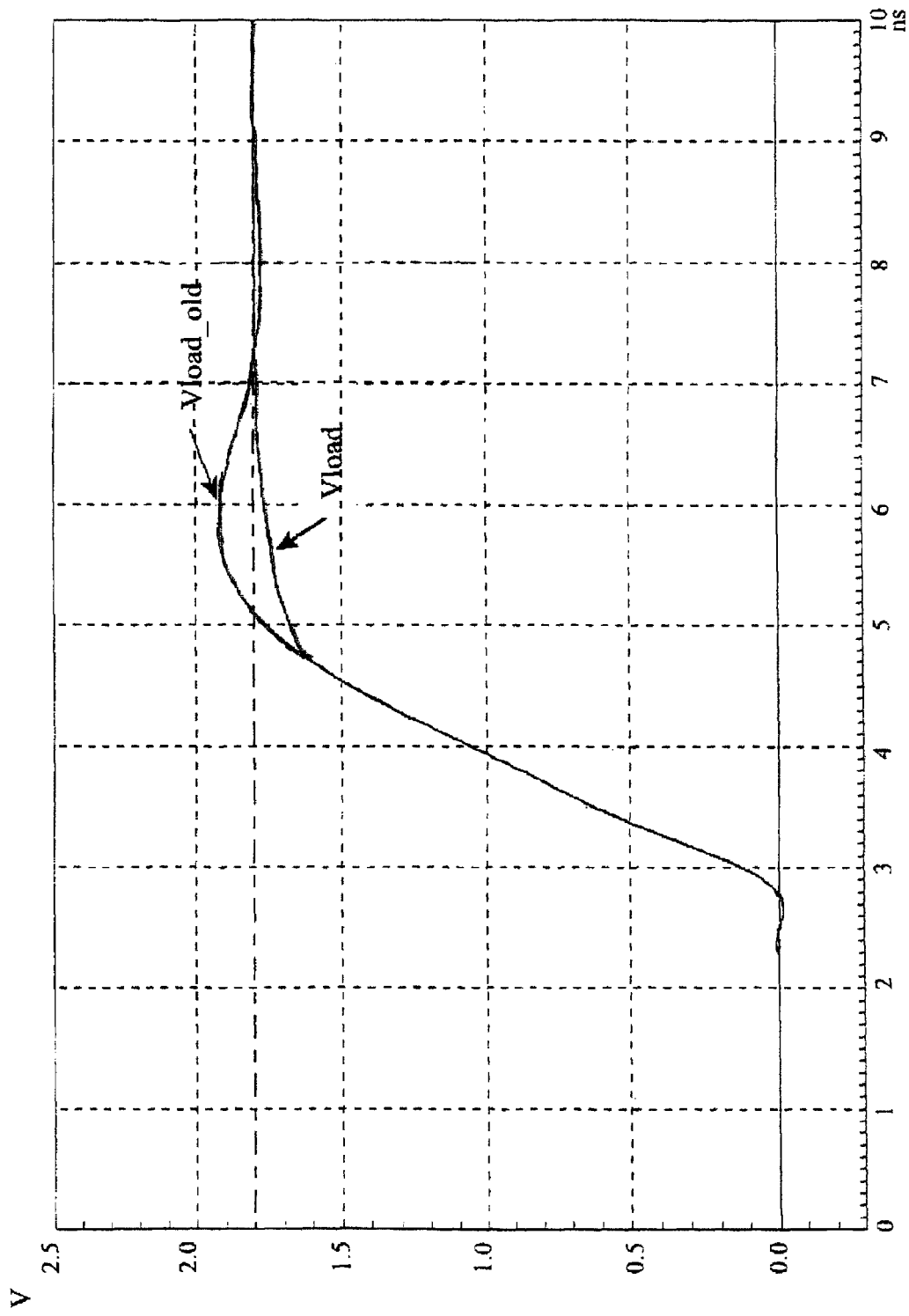
FIG. 14 schematically shown the progress of voltage signals applied to a capacitive load by an output buffer realized according to the invention and shown in FIG. 6 and by an output buffer realized according to the prior art.

The progresses have thus been obtained of the voltage signal Vload on a capacitive load driven by the output buffer 10 according to the invention and of the voltage signal Vload_old on a capacitive load driven by the output buffer 1 realized according to the prior art shown in comparison in FIG. 14.

As it can be noted, the voltage signal Vload on the load, although carrying out the transition quickly, does not have the over elongations of the voltage signal Vload_old relative to the output buffer 1 realized according to the prior art, being the output resistance of the output buffer 10 according to the invention, in the final part of the transient, equal to the impedance characteristic of the transmission line.

In conclusion, the output buffer 10 according to the invention has such an output impedance controlled value as to reduce the over/under elongations of a voltage signal applied to a load connected thereto, optimizing in the meantime the transition time of the output terminal PAD. Moreover, the circuit architecture proposed for the output buffer 10 makes it possible to realize a buffer suitable for a transmission line, once the impedance characteristic of the line itself is known.

Although preferred embodiments of the device of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electronic device, comprising:
a first circuit;
a second circuit to measure the current output of the first circuit, said second circuit to replicate the first circuit without altering the performance of said first circuit;
a current detector to detect current output by said second circuit, said current detector to detect the maximum value of the current drawn by said first circuit;
a comparison block coupled to said current detector to detect whether the maximum value of the detected current exceeds a threshold; and
a regulator to regulate an output impedance value of said first circuit based on said comparison.

2. The electronic device according to claim 1, wherein said second circuit comprises circuit elements corresponding to circuit elements of said first circuit.

3. The electronic device according to claim 2, wherein said circuit elements of said second circuit have smaller sizes with respect to said circuit elements of said first circuit.

4. The electronic device according to claim 1, including a second detector of a drawn current connected to said second circuit.

5. The electronic device according to claim 4, wherein said current detector comprises at least a current mirror including a first and a second mirror transistor, connected to a first voltage reference, as well as to said second circuit and to a first inner circuit node, in turn connected, by means of a first triggering transistor, to a second voltage reference, said first triggering transistor having a control terminal receiving a first triggering signal and said second circuit receiving a first driving signal.

6. The electronic device according to claim 5, wherein said current detector further comprises a second triggering transistor inserted between said first supply voltage reference and said common control terminals of said mirror transistors and having in turn a control terminal receiving a second triggering signal.

7. The electronic device according to claim 6, wherein said current detector further comprises a first and a second biasing transistor inserted, in series to each other, between said first inner circuit node and said second voltage reference, and having control terminals connected to said second and first voltage references, respectively.

8. The electronic device according to claim 7, wherein said current detector further comprises a generator, in turn including a first and a second inverter in cascade to each other and connected to said first inner circuit node to output a first control signal.

9. The electronic device according to claim 5, wherein said second detector comprises at least a current mirror including a first and a second mirror transistor, connected to said first voltage reference, to said second circuit and to a second inner circuit node, in turn connected, through a first triggering transistor, to said first voltage reference, said first triggering transistor having a control terminal receiving a first triggering signal and said second current receiving a second driving signal.

10. The electronic device according to claim 9, wherein said second detector comprises a further input transistor connected to said duplicated structure and having a control terminal receiving said second driving signal.

11. The electronic device according to claim 10, wherein said second detector further comprises a second triggering transistor inserted between common control terminals of said mirror transistors and said second voltage reference and having in turn a control terminal receiving a second triggering signal.

12. The electronic device according to claim 11, wherein said second detector further comprises a first and a second biasing transistor inserted, in series to each other, between said second inner circuit node and said first voltage reference and having control terminals connected to said second and first voltage references, respectively.

13. The electronic device according to claim 12, wherein said second detector further comprises a third generator, in turn including a first and a second inverter in cascade to each other and connected to said second inner circuit node to output said second control signal.

14. The electronic device according to claim 1, wherein said second circuit comprises a circuit block formed by a first and a second duplicated transistor having sizes significantly smaller than transistors of said first circuit, and receiving, on control terminals, driving signals corresponding to driving signals of said transistors of said first circuit, said second circuit outputting a first and a second control signal.

15. The electronic device according to claim 1 wherein said first circuit includes an output buffer.

16. An electronic device, comprising:
a first circuit;
a second circuit to measure the current output of the first circuit, said second circuit to replicate the first circuit without altering the performance of said first circuit;
a current detector to detect current output by said second circuit; and
a second detector of a drawn current connected to said second circuit, wherein said current detector comprises at least a current minor including a first and a second mirror transistor, connected to a first voltage reference, as well as to said second circuit and to a first inner circuit node, in turn connected, by means of a first triggering transistor, to a second voltage reference, said first triggering transistor having a control terminal receiving a first triggering signal and said second circuit receiving a first driving signal.

17. The electronic device according to claim 16, wherein said current detector further comprises a second triggering transistor inserted between said first supply voltage reference and said common control terminals of said mirror transistors and having in turn a control terminal receiving a second triggering signal.

18. The electronic device according to claim 17, wherein said current detector further comprises a first and a second biasing transistor inserted, in series to each other, between said first inner circuit node and said second voltage reference, and having control terminals connected to said second and first voltage references, respectively.

19. The electronic device according to claim 18, wherein said current detector further comprises a generator, in turn including a first and a second inverter in cascade to each other and connected to said first inner circuit node to output a first control signal.

20. The electronic device according to claim 16, wherein said second detector comprises at least a current minor including a first and a second minor transistor, connected to said first voltage reference, to said second circuit and to a second inner circuit node, in turn connected, through a first triggering transistor, to said first voltage reference, said first triggering transistor having a control terminal receiving a first triggering signal and said second current receiving a second driving signal.

* * * * *

UNITED STATES PATENT AND TRADEMARK OFFICE
CERTIFICATE OF CORRECTION

PATENT NO.       : 7,804,322 B2                                 Page 1 of 1
APPLICATION NO.  : 12/261101
DATED            : September 28, 2010
INVENTOR(S)      : Michele Bartolini et al.

It is certified that error appears in the above-identified patent and that said Letters Patent is hereby corrected as shown below:

Column 15:
Line 34, "minor" should be --mirror--.

Column 16:
Line 26, "minor" should be --mirror--.
Line 27, "minor" should be --mirror--.

Signed and Sealed this

Thirtieth Day of November, 2010

David J. Kappos
*Director of the United States Patent and Trademark Office*